(12) United States Patent
Lim et al.

(10) Patent No.: US 10,560,216 B2
(45) Date of Patent: Feb. 11, 2020

(54) METHOD AND APPARATUS FOR TRANSMITTING/RECEIVING SIGNAL IN COMMUNICATION SYSTEM

(71) Applicant: Samsung Electronics Co., Ltd., Gyeonggi-do (KR)

(72) Inventors: Chi-Woo Lim, Suwon-si (KR); Jae-Yoel Kim, Seongnam-si (KR); Woo-Myoung Park, Suwon-si (KR); Seok-Ki Ahn, Suwon-si (KR); Min Jang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 267 days.

(21) Appl. No.: 15/405,096

(22) Filed: Jan. 12, 2017

(65) Prior Publication Data

US 2017/0201344 A1 Jul. 13, 2017

(30) Foreign Application Priority Data

Jan. 12, 2016 (KR) .......................... 10-2016-0003706

(51) Int. Cl.
| | | |
|---|---|---|
| *H04L 1/18* | (2006.01) | |
| *H04L 1/00* | (2006.01) | |
| *H03M 13/11* | (2006.01) | |
| *H03M 13/00* | (2006.01) | |

(52) U.S. Cl.
CPC ....... *H04L 1/0009* (2013.01); *H03M 13/1102* (2013.01); *H03M 13/6306* (2013.01); *H04L 1/0025* (2013.01); *H04L 1/0041* (2013.01); *H04L 1/0045* (2013.01); *H04L 1/1819* (2013.01); *H04L 1/1874* (2013.01)

(58) Field of Classification Search
CPC ... H04L 1/0009; H04L 1/1874; H04L 1/1819; H04L 1/0025; H04L 1/0045; H04L 1/0041; H03M 13/6306; H03M 13/1102
USPC .......................................................... 714/776
See application file for complete search history.

(56) References Cited

U.S. PATENT DOCUMENTS

| | | | |
|---|---|---|---|
| 10,030,456 B2 * | 7/2018 | Miller | ...................... E21B 28/00 |
| 2005/0149841 A1 * | 7/2005 | Kyung | .............. H03M 13/2957 |
| | | | 714/800 |
| 2007/0220399 A1 | 9/2007 | Kim et al. | |

(Continued)

FOREIGN PATENT DOCUMENTS

KR 10-0981500 B1 9/2010

*Primary Examiner* — Samir W Rizk
*Assistant Examiner* — Enam Ahmed

(57) ABSTRACT

Fifth Generation (5G) or pre-5G communication system for supporting a data transfer rate higher than that of a fourth Generation (4G) communication system, such as Long Term Evolution (LTE), and subsequent systems. The present disclosure provides a method for transmitting a signal by a transmission terminal in a communication system using a Low Density Parity Check (LDPC) code. The method include receiving a change request for changing a coding rate of the LDPC code, from a reception terminal; determining a first coding rate based on the change request; and transmitting information on the first coding rate in respond to the change request, to a reception terminal, wherein the change request for changing the coding rate comprises at least one of information indicating a coding rate determined by the reception terminal, or information indicating a state of the reception terminal.

16 Claims, 5 Drawing Sheets

(56) References Cited

U.S. PATENT DOCUMENTS

| | | | | |
|---|---|---|---|---|
| 2008/0028281 | A1* | 1/2008 | Miyazaki | H03M 13/1102 |
| | | | | 714/776 |
| 2009/0060094 | A1* | 3/2009 | Jung | H04B 1/69 |
| | | | | 375/340 |
| 2015/0349807 | A1* | 12/2015 | Vernon | H03M 13/353 |
| | | | | 714/774 |
| 2015/0363262 | A1* | 12/2015 | Hu | G06F 11/1048 |
| | | | | 714/773 |
| 2016/0079998 | A1* | 3/2016 | Shinohara | H04L 1/0041 |
| | | | | 714/776 |
| 2016/0126979 | A1* | 5/2016 | Murakami | H03M 13/036 |
| | | | | 714/776 |

\* cited by examiner

METHOD AND APPARATUS FOR TRANSMITTING/RECEIVING SIGNAL IN COMMUNICATION SYSTEM

CROSS-REFERENCE TO RELATED APPLICATION(S) AND CLAIM OF PRIORITY

This application claims the priority under 35 U.S.C. § 119(a) to Korean Application Serial No. 10-2016-0003706, which was filed in the Korean Intellectual Property Office on Jan. 12, 2016, the entire content of which is hereby incorporated by reference.

TECHNICAL FIELD

The present disclosure relates to an apparatus and a method for transmitting/receiving a signal which use an incremental redundancy hybrid auto retransmit request (IR HARQ) scheme in a communication system using a low density parity check (LDPC) code.

BACKGROUND

In order to meet the demand for wireless data traffic which has increased since the commercialization of the fourth Generation (4G) communication system, efforts have been made to develop an improved fifth Generation (5G) communication system or a pre-5G communication system. For this reason, the 5G or pre-5G communication system is called a "beyond 4G network communication system" or a "post long-term evolution (LTE) communication system."

In order to achieve a high data transfer rate, the 5G communication system is considered to be implemented in an ultra-high frequency (millimeter Wave (mmWave)) band (e.g., 60 GHz band). In order to reduce the path loss of radio waves and increase the transmission distance thereof in the mmWave band, techniques, such as beamforming, massive multiple-input multiple-output (MIMO), full dimensional MIMO (FD-MIMO), array antenna, analog beamforming, and large scale antenna, are under discussion in the 5G communication system.

Also, in order to improve a network of a system, the development of techniques, such as evolved small cell, advanced small cell, cloud radio access network (cloud RAN), ultra-dense network, device-to-device (D2D) communication, wireless backhaul, moving network, cooperative communication, coordinated multi-points (CoMP), and reception interference cancellation, has been conducted in the 5G communication system.

In addition, hybrid frequency shift keying (FSK) and quadrature amplitude modulation (QAM) modulation (FQAM) and sliding window superposition coding (SWSC), which are advanced coding modulation (ACM) schemes; and filter bank multi-carrier (FBMC), non-orthogonal multiple access (NOMA), and sparse code multiple access (SCMA), which are advanced access techniques, have been developed in the 5G system.

Since various attempts have been made to apply the 5G communication system to an Internet of Things (IoT) network, channel coding is required which supports not only a high data transfer rate but also a low data transfer rate. Accordingly, an LDPC code, which can operate with low power (areal efficiency) which is four times lower than or is more than four times lower than that of a turbo code, is considered as a representative next-generation error correction technique.

The LDCP code to be applied in the 5G system needs to support not only a high data transfer rate but also a low data transfer rate, and thus uses a parity check matrix (PCM) having a low coding rate. Accordingly, when a typical decoder is implemented, a decoder corresponding to the lowest coding rate is implemented. In contrast, when a decoder is actually operated, in order to reduce consumed power, it is unnecessary to perform entire decoding by using a low coding rate, and thus, the size of a required HARQ buffer is increased.

Therefore, there is a need for various transmission techniques capable of obtaining a performance gain by adaptively changing a modulation parameter, a coding rate, and the like according to conditions of channels and resources.

SUMMARY

To address the above-discussed deficiencies, it is a primary object to provide a method and an apparatus for transmitting and/or receiving a signal in a communication system.

Embodiments of the present disclosure provide a method and an apparatus for variably operating a mother coding rate used during the transmission and/or reception of a signal in a communication system.

Embodiments of the present disclosure provide a method and an apparatus for configuring control information for rate matching during the operation of an IR-HARQ for transmitting and/or receiving a signal in a communication system.

In accordance with an aspect of the present disclosure, a method for transmitting a signal by a transmission terminal in a communication system using a low density parity check (LDPC) code is provided. The method may receiving a change request for changing a coding rate of the LDPC code, from a reception terminal; determining a first coding rate based on the change request; and transmitting information on the first coding rate in respond to the change request, to a reception terminal, wherein the change request for changing the coding rate comprises at least one of information indicating a coding rate determined by the reception terminal, or information indicating a state of the reception terminal.

In accordance with another aspect of the present disclosure, a method for receiving a signal by a reception terminal in a communication system using a low density parity check (LDPC) code is provided. The method may include determining whether a change of a coding rate of the LDPC code is required; transmitting, to a transmission terminal, a coding rate change request if the change of the coding rate of the LDPC code is required; and receiving, from the transmission terminal, a first coding rate in response to the coding rate change request, wherein the coding rate change request comprises at least one of information indicating a second coding rate determined by the reception terminal, or information indicating a state of the reception terminal.

In accordance with still another aspect of the present disclosure, a transmission terminal for transmitting a signal in a communication system using a low density parity check (LDPC) code is provided. The transmission terminal may include a transceiver configured to receive, from a reception terminal, a change request for changing a coding rate of the LDPC code, and to transmit a first coding rate in respond to the change request; and a controller configured to determine the first coding rate based on the change request, wherein the change request for changing the coding rate comprises at least one of information indicating a coding rate determined by the reception terminal, or information indicating a state of the reception terminal.

In accordance with yet another aspect of the present disclosure, a reception terminal for receiving a signal in a communication system using a low density parity check (LDPC) code is provided. The reception terminal may include a controller configured to determine whether a change of a coding rate of the LDPC code is required; and a transceiver configured to transmit a coding rate change request to a transmission terminal if the change of the coding rate of the LDPC code is required, and to receive, from the transmission terminal, a first coding rate in response to the coding rate change request, wherein the coding rate change request comprises at least one of information indicating a second coding rate determined by the reception terminal, or information indicating a state of the reception terminal.

Other aspects, advantages, and essential features of the present disclosure are processed together with additional drawings, and will be apparent to those skilled in the art from the following detailed description of exemplary embodiments of the present disclosure.

Before undertaking the detailed description of the present disclosure below, it may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions are applied in many, if not most, instances to prior as well as future uses of such defined words and phrases.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
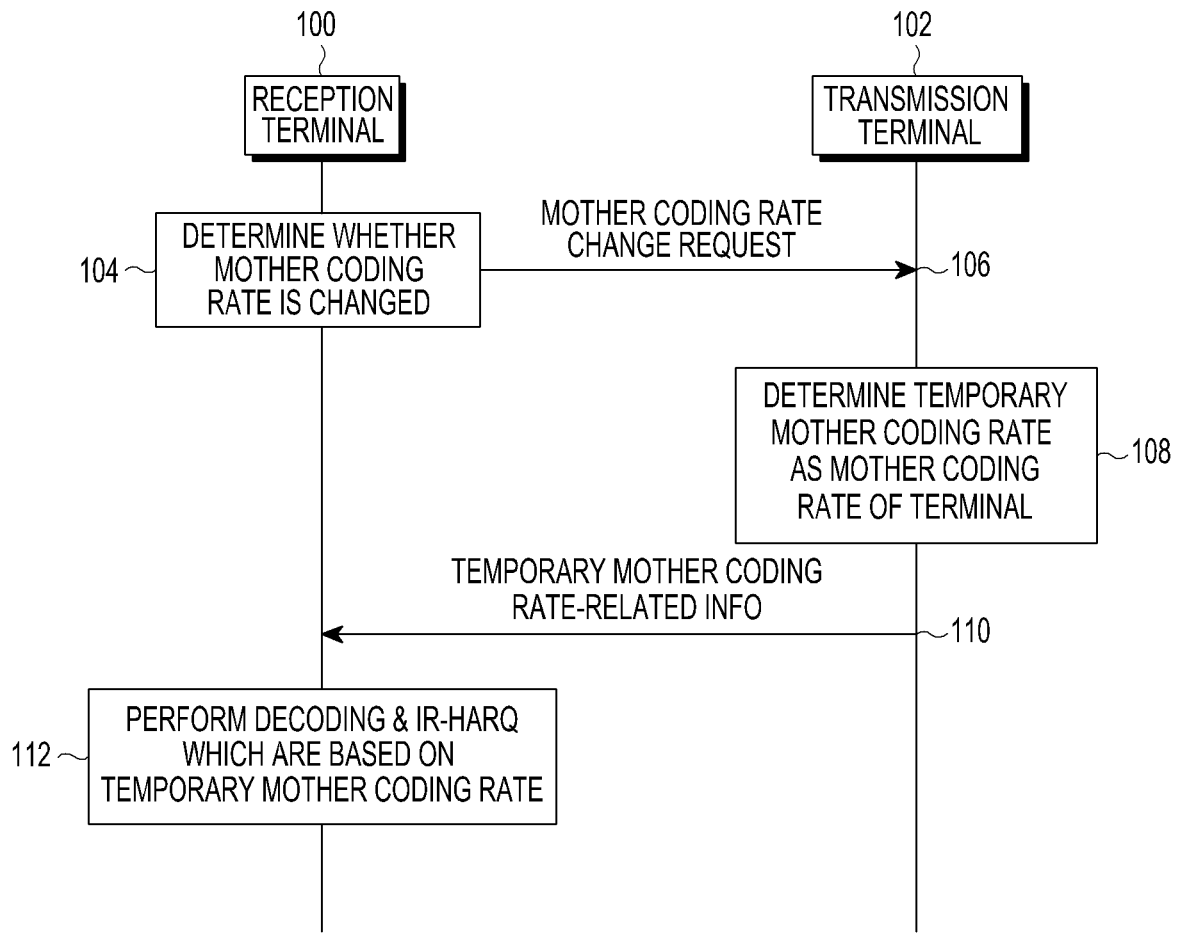
FIG. 1 illustrates a signal flow diagram of an IR-HARQ operation according to a mother coding rate change request of a reception terminal according to an embodiment of the present disclosure.

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, the operating principle of exemplary embodiments of the present disclosure will be described in detail with reference to the accompanying drawings. The same reference numerals will designate the same elements in the drawings where possible although they are shown in different drawings. In describing the present disclosure below, a detailed description of related known configurations or functions incorporated herein will be omitted when it is determined that the detailed description thereof may unnecessarily obscure the subject matter of the present disclosure. Also, terms described below are defined in view of functions in the present disclosure, and can be different depending on user and operator's intention or practice. Therefore, the terms should be defined based on the disclosure throughout this specification.

The present disclosure may be modified in various ways, and may have various embodiments, among which specific embodiments will be described in detail with reference to the accompanying drawings. However, it should be understood that the description of the specific embodiments of the present disclosure is not intended to limit the present disclosure to a particular mode of practice, and that the present disclosure is to cover all modifications, equivalents, and substitutes included in the spirit and technical scope of the present disclosure.

Also, in this specification, it could be understood that singular expressions such as "a," "an" and "the" include plural expressions as well, unless the context clearly indicates otherwise. Accordingly, as an example, a "component surface" includes one or more component surfaces.

Further, although the terms including ordinal numbers such as first and second may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

The terms used herein are only used to describe particular embodiments of the present disclosure, and are not intended to limit the present disclosure. As used herein, the singular forms are intended to include the plural forms as well, unless the context clearly indicates otherwise. In this specification, it should be understood that the terms "comprising," "including" or "having" are intended to indicate the existence of the features, numbers, steps, operations, elements, parts, or combinations thereof disclosed in the specification, and are not intended to preclude the possibility that one or more other features, numbers, steps, operations, elements, parts, or combinations thereof may exist or may be added.

Also, in embodiments of the present disclosure, unless otherwise defined, all terms (including technical and scientific terms) used herein have the same meaning as commonly understood by those having ordinary knowledge in the technical field to which the present disclosure pertains. Terms, such as those defined in commonly used dictionaries, should be interpreted as having a meaning that is consistent with their meaning in the context of the relevant art, and will not be interpreted in an idealized or overly formal sense unless expressly so defined in embodiments of the present disclosure.

Hereinafter, the present disclosure relates to a method and an apparatus for transmitting/receiving a signal in a communication system using an LDPC code, and proposes a method and an apparatus for transmitting/receiving a signal when an IR scheme is used among HARQ schemes in a communication system using an LDPC code. Although the case of a communication system using an LDPC code is described as an example in describing the method and the apparatus for transmitting/receiving a signal which are proposed in the present disclosure, it should be noted that the method and the apparatus for transmitting/receiving a signal which are proposed in the present disclosure are not limited only to the case of using the LDPC code.

Typically, when a packet is initially transmitted, an IR-HARQ scheme transmits the packet in a state of not adding a redundant bit to the packet or adding only a very small part to the packet. Thereafter, in the process of repeatedly transmitting the identical packet, the IR-HARQ scheme increases the number of redundant bits and then retransmits only the redundant bits, and a reception terminal stores a failed packet. Accordingly, the reception terminal that has received the retransmitted packet combines a packet, that the reception terminal has failed to store, with the retransmitted redundant bits, and decodes the packet combined with the retransmitted redundant bits. At this time, a coding rate is reduced, but rather, a coding gain is increased.

When a transmission terminal performs an IR-HARQ scheme, the transmission terminal uses an HARQ buffer in order to store packets to be retransmitted. A circular buffer, that stores data as in a case where a start of the buffer comes into contact with an end thereof, is usually used as the HARQ buffer. As an example, the 5G system needs to support a coding rate which is higher than or equal to 5 Gbps, and thus requires a significantly large HARQ buffer. The size of the buffer required by the IR-HARQ scheme may be calculated by using equation (1) below.

$$\text{throughput (data transfer rate)} \times \text{RTT\_HARQ/mother coding rate} \times \text{LLR\_bits} \qquad (1)$$

where, a throughput represents a signal transfer rate (bits/s) of the transmission terminal, a round trip time (RTT)_HARQ represents a retransmission time point of a signal during the operation of an IR-HARQ, and log likelihood ratio (LLR) bits represent the number of bits expressing an LLR value of a signal received through a relevant channel when the reception terminal performs decoding.

As expressed by equation (1), when the IR-HARQ scheme is operated, the mother coding rate may significantly affect the size of the HARQ buffer. Accordingly, when consideration is given to a case where a minimum coding rate is used, a coding gain becomes higher but the size of a required HARQ buffer becomes larger than when a high coding rate is used.

Therefore, hereinafter, an embodiment of the present disclosure proposes a method for variably using a mother coding rate during the operation of an IR-HARQ. Specifically, according to an embodiment of the present disclosure, the reception terminal may determine whether a mother coding rate is changed, on the basis of a predetermined condition, and may request the transmission terminal to change the mother coding rate. FIG. 1 illustrates a signal flow diagram of an IR-HARQ operation according to a mother coding rate change request of a reception terminal according to an embodiment of the present disclosure.

Referring to FIG. 1, in operation 104, a reception terminal 100 may identify a predetermined condition, for example, current states of a battery and an HARQ buffer, and may determine whether a default mother coding rate is changed. Specifically, the reception terminal 100 may compare a power amount of the battery with a power threshold and may determine a current state of the battery. For example, a power amount corresponding to an optional ratio (e.g., 1/3 or 2/3) over the total power of the battery may be determined as a power threshold, and the current state of the battery may be expressed as a predetermined level, according to a result of comparing a current power amount with the power threshold. For example, the current state of the battery is expressed as a low level when the current power amount is less than the power threshold corresponding to 1/3, and the current state of the battery is expressed as an intermediate level when the current power amount is greater than or equal to the power threshold corresponding to 1/3 and is less than the power threshold corresponding to 2/3. Also, the current state of the battery is expressed as a high level when the current power amount is greater than or equal to the power threshold corresponding to 2/3. Similarly, a state of the HARQ buffer may also be determined by comparing a buffer amount currently stored in the buffer with a predetermined buffer amount threshold. In the present example, a buffer amount threshold may be determined as a buffer amount corresponding to an optional ratio over the total buffer amount of the HARQ buffer, and a current buffer amount may be expressed as a predetermined level, according to a result of comparing the current buffer amount with the buffer amount threshold. Also, according to an embodiment of the present disclosure, the power threshold and the buffer threshold may be set to optional values by the reception terminal 100, or may be previously set to values received from a transmission terminal 102.

Further, when the current states of the battery and the HARQ buffer have been determined, the reception terminal 100 may determine whether the determined current states of the battery and the HARQ buffer satisfy a change condition of a mother coding rate. When it is determined that the determined current states of the battery and the HARQ buffer satisfy the change condition of the mother coding rate, the reception terminal 100 according to an embodiment of the present disclosure may generate a mother coding rate change request. According to an embodiment of the present disclosure, the change condition of the mother coding rate may be optionally determined by the reception terminal 100, or may be previously received from the transmission terminal 102. For example, a case is considered in which the change condition of the mother coding rate corresponds to a case where at least one of the current buffer amount and the state of the HARQ buffer corresponds to a low level. At this time, according to an embodiment of the present disclosure, the reception terminal 100 may previously exchange, with the transmission terminal 102, and may store mapping information of a temporary mother coding rate which is applicable for each of ranges of the state of the battery and the state of the HARQ buffer. Then, the reception terminal 100 may select a temporary mother coding rate mapped to a range, which includes the determined current states of the battery and the HARQ buffer, from among the ranges. According to an embodiment of the present disclosure, the mapping information may be used to map a relevant temporary mother coding rate to a range of at least one of the state of the battery and the state of the HARQ buffer on the basis of the range. When the reception terminal 100 has determined the temporary mother coding rate on the basis of the currently-determined state of the battery and state of the HARQ buffer, the mother coding rate change request may include information indicating the determined temporary mother coding rate or information indicating a request for increasing a mother coding rate by the determined temporary mother coding rate. In an embodiment of the present disclosure, consideration is given to a state in which temporary mother coding rates obtained by increasing the mother coding rate by a predetermined ratio are previously set and information on the temporary mother coding rates is previously exchanged between the transmission terminal 102 and the reception terminal 100 before performing an IR-HARQ. The information on the temporary mother coding rates may be configured by mapping indices indicating the respective determined temporary mother coding rates, as an example. In this case, in operation 106, the reception terminal 100 may include an index, which corresponds to the determined temporary mother coding rate, in the mother coding rate change request, and may transmit the mother coding rate change request including the index.

Thereafter, in a state where the reception terminal 100 and the transmission terminal 102 are using the temporary mother coding rate determined according to the above-described procedure, when the reception terminal 100 detects that the current states of the battery and the HARQ buffer satisfy the mother coding rate change condition, the reception terminal 100 may generate a request for increasing the temporary mother coding rate, which is currently being used, or information indicating another temporary mother coding rate, and may include the generated request or information in the mother coding rate change request in operation 106 and may transmit the mother coding rate change request including the generated request or information. According to an embodiment of the present disclosure, a time point at which the reception terminal 100 transmits the mother coding rate change request may correspond to a time point at which the reception terminal 100 detects that the current states of the battery and the HARQ buffer satisfy the mother coding rate change condition. Alternatively, according to an embodiment of the present disclosure, the reception terminal 100 may determine whether the mother coding rate change condition is satisfied, according to a cycle acquired from the transmission terminal 102, and may periodically make a mother coding rate change request according to a result of the determination. Also, the mother coding rate change request according to an embodiment of the present disclosure may not be transmitted through a separate uplink control channel, but may be transmitted in the form of a piggyback through an existing control channel.

In operation 108, the transmission terminal 102 may determine a mother coding rate, which is to be currently used, in response to the mother coding rate change request. When the mother coding rate change request includes an index indicating a temporary mother coding rate, the transmission terminal 102 may set a mother coding rate, which is to be currently used, to the temporary mother coding rate corresponding to the index. When the mother coding rate change request includes a request for increasing the mother coding rate or the temporary mother coding rate currently being used, the transmission terminal 102 may determine a channel state on the basis of a channel measurement report fed back from the reception terminal 100, and may determine a mother coding rate, which is to be currently used, in view of the determined channel state. As a specific example, consideration is given to a case where temporary mother coding rates of 2/3, 3/4, and 4/5 are determined which have previously been set by the transmission terminal 102 together with the reception terminal 100, and a case where corresponding channel state ranges are mapped to the respective temporary mother coding rates. Then, in order to determine a channel state, the transmission terminal 102 may determine a current state on the basis of, for example, channel quality information (CQI) included in the channel measurement report fed back from the reception terminal 100, as an example. Next, the transmission terminal 102 may determine a temporary mother coding rate, which is mapped to a channel state range including the determined current channel state, as a coding rate to be currently used. In the present example, examples of parameters that the transmission terminal 102 uses to determine the channel state may include a received signal strength indicator (RSSI), a signal-to-noise ratio (SNR), and the like, as well as the CQI. According to another embodiment of the present disclosure, even when the mother coding rate change request includes an index corresponding to the temporary mother coding rate determined by the reception terminal 100, the transmission terminal 102 may additionally determine a temporary mother coding rate corresponding to a channel state between the transmission terminal 102 and the reception terminal 100. Also, when a temporary mother coding rate corresponding to the channel state is different from the temporary mother coding rate corresponding to the index included in the mother coding rate change request, the transmission terminal 102 may determine a higher coding rate from among the temporary mother coding rates, as a coding rate to be currently used.

Then, in operation 110, the transmission terminal 102 may transmit information, which is related to the determined temporary mother coding rate, to the reception terminal 100. In the present example, the temporary mother coding rate-related information may indicate the determined temporary mother coding rate, or may express the temporary mother coding rate by using an index that the transmission terminal 102 has previously agreed upon with the reception terminal 100. Also, the temporary mother coding rate-related information according to an embodiment of the present disclosure may be transmitted by using a radio resource control (RRC) message, or may be transmitted through a control channel to which a field indicating the temporary mother coding rate is added. When the field indicating the temporary mother coding rate is added to the control channel, in order to reduce overhead, a changeable value may be previously defined, and may then be expressed in the foam of an index. For example, when a default mother coding rate is 1/3, consideration is given to a case where the value of the field is expressed by using one bit. In this case, the field may indicate a temporary mother coding rate of 1/2 when the value of the field is 0, and the field may indicate a temporary mother coding rate of 2/3 when the value of the field is 1.

In operation 112, the reception terminal 100, that has received the temporary mother coding rate-related information from the transmission terminal 102, may perform decoding and IR-HARQ operations on packets received from the transmission terminal 102, by using a temporary mother coding rate acquired from the temporary mother coding rate-related information.

As described above, when the mother coding rate is changed and used in view of the state of the battery of the reception terminal 100 and the state of the HARQ buffer, the channel state between the transmission terminal 102 and the reception terminal 100, and the like according to an embodiment of the present disclosure, consumed power can be more efficiently managed than when a default mother coding rate is used. Table 1 below shows an example of consumed power of the transmission terminal when a mother coding rate is changed according to a first embodiment of the present disclosure.

TABLE 1

| R = 1/3 | R = 1/2 | R = 2/3 | R = 5/6 |
|---------|---------|---------|---------|
| 100     | 67      | 50      | 40      |

Referring to Table 1, when consideration is given to a case where consumed power used by the transmission terminal is 100 when a default mother coding rate is 1/3, the consumed power used by the transmission terminal becomes smaller than the consumed power used with a default coding rate as the mother coding rate is increased.

Meanwhile, in another embodiment of FIG. 1, the reception terminal 100 determines a current state of the battery and a current state of the HARQ buffer in operation 104, only determines whether a mother coding rate change condition is satisfied, on the basis of the determined states of the battery and the HARQ buffer, and only identifies whether the mother coding rate change condition is satisfied. Accordingly, when the mother coding rate change condition is satisfied, the reception terminal 100 may not determine a temporary mother coding rate to be changed; and in operation 106, may include information indicating the determined states of the battery and the HARQ buffer in the mother coding rate change request, and may transmit the mother coding rate change request including the information. Then, in another embodiment of FIG. 1, in operation 104 of FIG. 1, the reception terminal 100 may not determine the temporary mother coding rate to be changed on the basis of the determined states of the battery and the HARQ buffer, but instead, the transmission terminal 102 may compare a power threshold with a buffer amount threshold on the basis of the current state of the battery of the reception terminal 100 and the current state of the HARQ buffer acquired from the mother coding rate change request, and may determine a temporary mother coding rate to be currently used. In this case, the power threshold and the buffer amount threshold may be previously determined by the reception terminal 100 and may be previously delivered from the reception terminal 100 to the transmission terminal 102, or may be set to optional values by the transmission terminal 102. In the present example, in operation 108, the transmission terminal 102 may determine the temporary mother coding rate, which is to be currently used, by additionally considering the channel state between the transmission terminal 102 and the reception terminal 100 as well as the current states of the battery and the HARQ buffer. For example, the transmission terminal 102 may select a higher coding rate from among temporary mother coding rates which are respectively determined in view of the current state of the battery, the current state of the HARQ buffer, and the current channel state. Alternatively, the transmission terminal 102 may determine the temporary mother coding rate in view of all of the current state of the battery, the current state of the HARQ buffer, and the current channel state.

According to still another embodiment of FIG. 1, in operation 104, the reception terminal 100 may determine a current state of the battery and a current state of the HARQ buffer, and may determine whether the determined states of the battery and the HARQ buffer satisfy a mother coding rate change condition. When it is determined that the determined states of the battery and the HARQ buffer satisfy the mother coding rate change condition, in operation 106, the reception terminal 100 may transmit a mother coding rate change request to the transmission terminal 102. In the present example, when receiving the mother coding rate change request, the transmission terminal 102 may determine a channel state on the basis of parameters acquired from a channel measurement report received from the reception terminal 100, and may determine a temporary mother coding rate, which corresponds to the determined channel state, as a mother coding rate to be currently used. In the present example, the parameters are identical to those described with reference to FIG. 1, and thus, a repeated description thereof will be omitted.

Figure 2:
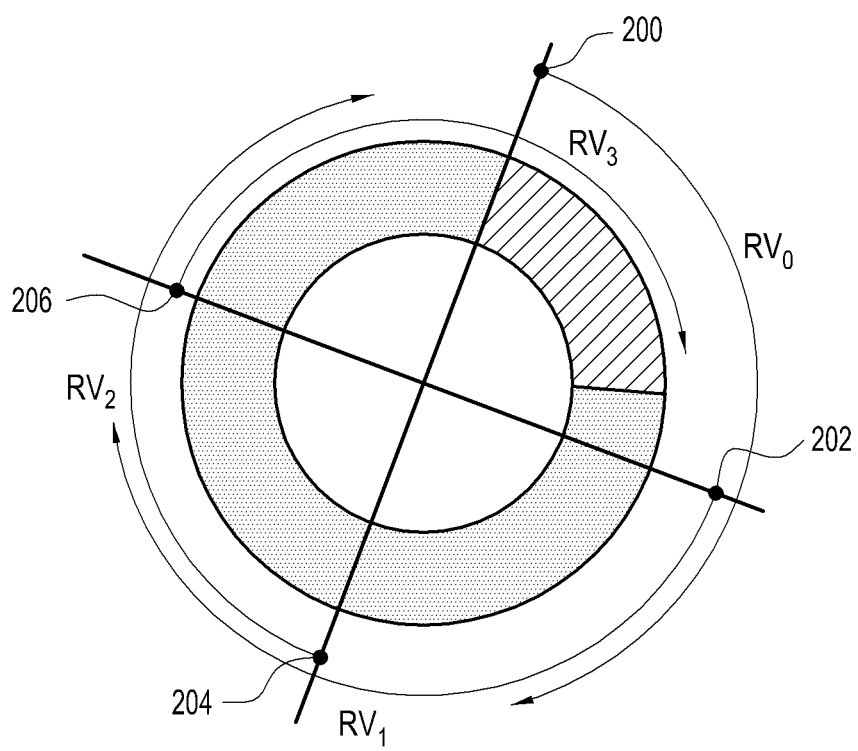
FIG. 2 illustrates an example of a structure of an HARQ buffer for circular buffer-based rate matching according to an embodiment of the present disclosure.

Meanwhile, when using an IR-HARQ, the transmission terminal 102 according to an embodiment of the present disclosure performs a circular buffer-based rate matching which converts a codeword packet, which is encoded according to a default mother coding rate or the temporary mother coding rate as described with reference to FIG. 1, into a sub-packet of a size which is desired to be transmitted. In order to generate a sub-packet by using the circular buffer-based rate matching, first, the transmission terminal 102 stores a codeword packet in a bitwise circular buffer. FIG. 2 illustrates an example of a structure of an HARQ buffer for circular buffer-based rate matching according to an embodiment of the present disclosure. In the present example, the HARQ buffer is a circular buffer, and thus has circular characteristics in which, when the HARQ buffer is accessed, a first bit index of the HARQ buffer is again accessed after a last bit index of the HARQ buffer is accessed. Also, when a codeword packet is stored in the HARQ buffer, systematic bits of the codeword packet are first stored, and parity bits of the codeword packet are stored. According to an embodiment of the present disclosure, when an IR-HARQ is used, multiple sub-packets used for initial transmission and retransmission are generated from one codeword packet. At this time, the sub-packets may be distinguished from each other by the lengths of the respective sub-packets and the start positions thereof. Information for distinguishing the respective sub-packets from each other is usually expressed as a redundancy version (RV) including two bits; and whenever transmitting each sub-packet, the transmission terminal transmits the sub-packet through a data channel, and transmits RV information of the sub-packet through a control channel. The RV information indicates one of start positions predetermined by the HARQ buffer. Referring to FIG. 2, the HARQ buffer has four predetermined start positions 200, 202, 204, and 206 as an example. Whenever transmitting each sub-packet, the transmission terminal selects one of the four start positions, and transmits an RV, which indicates the selected start position, through the control channel. Each of the sub-packets required for IR-HARQ transmission is transmitted to only an identical direction by using one of the four start positions, and has a variable size. Accordingly, in order to obtain an average HARQ gain, the start positions illustrated in FIG. 2 are located at equal intervals, and the respective sub-packets are stored in only identical directions. Since the sub-packets have variable sizes, as illustrated in FIG. 2, when RVs corresponding to fixed start positions are used, a part overlapping between the sub-packets is generated and parts which cannot be transmitted in a codeword packet may be generated. Also, when more start positions are set in order to increase an HARQ coding gain, the size of the RV information may become larger. Accordingly, hereinafter, a second embodiment of the present disclosure proposes a method for adaptively determining a start position of a sub-packet to be transmitted in response to a variable size of a packet and configuring RV information corresponding to the determined start position.

Specifically, when a turbo code is used, a priority exists between information bits and parity bits, but a coding rate which is less than or equal to 1 is usually used and thus, the information bits are all transmitted. In comparison, when an LDPC code is used, a priority exists according to a high or low degree between variable nodes corresponding to a coding vector of a parity check matrix (PCM). In the present example, the degree is defined as the number of connection lines between variable nodes and check nodes. Therefore, in view of a priority according to the degree of an LDPC code, the second embodiment of the present disclosure proposes a method for configuring an RV in view of degrees of variable nodes corresponding to a coding matrix when a packet to be to transmitted by the transmission terminal is decoded by using a PCM during the operation of an IR-HARQ.

Specifically, among sub-packets to be stored in the HARQ buffer according to an embodiment of the present disclosure, a sub-packet, which includes bits corresponding to a variable node having a relatively high degree, has a higher priority than a sub-packet including bits corresponding to a variable node having a relatively low degree. Accordingly, an embodiment of the present disclosure proposes an RV configuration method capable of causing a sub-packet, which includes bits corresponding to a variable node having a relatively high degree in the HARQ buffer, to be transmitted in a prioritized manner since the size of allocated resources is variable during retransmission in an IR-HARQ.

Figure 3A:
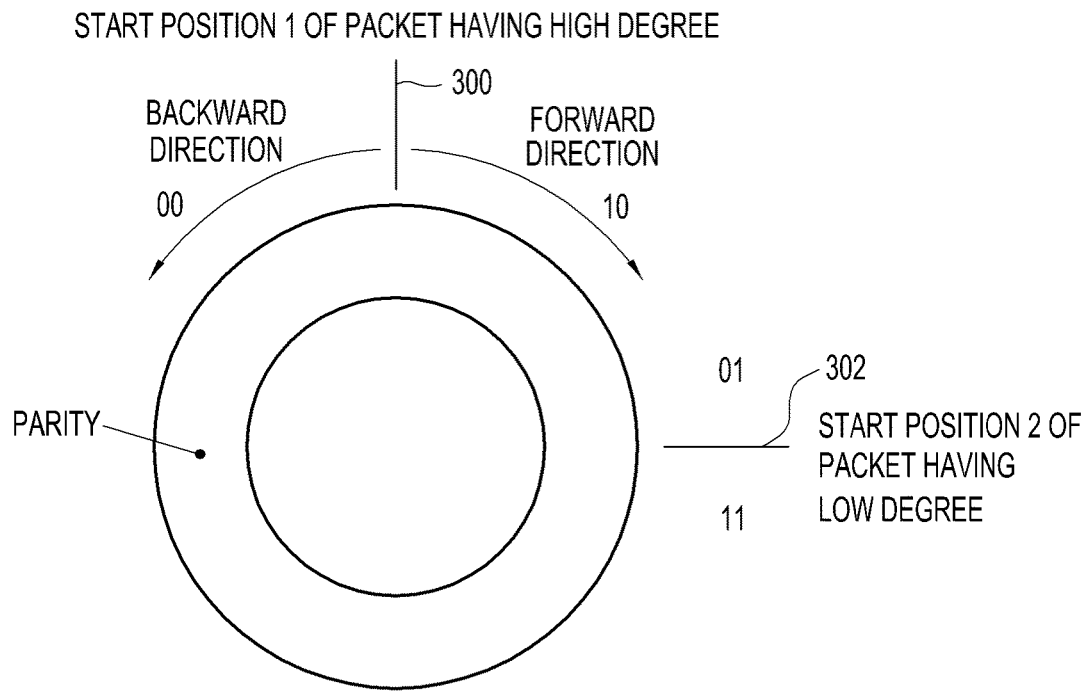
FIG. 3A illustrates an example of a structure of an HARQ buffer for circular buffer-based rate matching according to an embodiment of the present disclosure.

FIG. 3A illustrates an example of a structure of an HARQ buffer for circular buffer-based rate matching according to an embodiment of the present disclosure.

Referring to FIG. 3A, with respect to a packet including information bits and with a degree threshold as a reference, the HARQ buffer according to an embodiment of the present disclosure includes a start position 1 300 in which a sub-packet (hereinafter referred to as a "sub-packet having a high degree"), which includes bits corresponding to a variable node having a degree greater than or equal to than the degree threshold, is stored; and a start position 2 302 in which a sub-packet (hereinafter referred to as a "sub-packet having a low degree"), which includes bits corresponding to a variable node having a degree less than the degree threshold, is stored. Also, consideration is given to a case where each of the two start positions 1 and 2 300 and 302 is capable of storing a relevant packet in both directions. For convenience of description, in this specification, the clockwise direction will be referred to as a "forward direction" and the counterclockwise direction will be referred to as a "backward direction." Accordingly, an RV according to an embodiment of the present disclosure is configured to cause one bit corresponding to the least significant bit (LSB) from among the existing two bits of the RV to indicate a start position. For example, the LSB may indicate the start position 2 302 for a sub-packet having a low degree, when the LSB of the RV is 1; and the LSB may indicate the start position 1 300 for a sub-packet having a high degree, when the LSB of the RV is 0. Also, one bit, which is the most significant bit (MSB) from among the two bits of the RV according to an embodiment of the present disclosure, is configured to indicate a direction (i.e., a forward or backward direction) in which a relevant sub-packet is stored in each start position. For example, the MSB may indicate that a direction in which a sub-packet is stored is the forward direction, when the MSB of the RV is 1; and the MSB may indicate that a direction in which the relevant sub-packet is stored is the backward direction, when the MSB of the RV is 0.

Then, the transmission terminal according to an embodiment of the present disclosure may classify sub-packets to be stored in the HARQ buffer into a sub-packet having a high degree and a sub-packet having a low degree, on the basis of the degree threshold, and may determine start positions and directions in which the classified sub-packets are to be stored. According to an embodiment of the present disclosure, a direction in which a relevant sub-packet is stored may be designated in both directions, from a start position of the HARQ buffer. Accordingly, a directivity in which sub-packets each having a high degree are stored may be designated from the start position 1 300 in view of a state in which the sub-packets each having a high degree are stored in the HARQ buffer. For example, when a sub-packet having a high degree is stored in the forward direction from the start position 1 300, a sub-packet having a high degree in the next order is stored in the backward direction from the start position 1 300, and accordingly, may be assigned a higher transmission priority than that of a sub-packet having a low degree or those of parity packets.

Meanwhile, according to another embodiment of the present disclosure, the RV may include a different number of bits. As a specific example, consideration is given to a case where the RV includes one bit. In this case, the center of the HARQ buffer may be set to a start position, and one bit may indicate a direction (i.e., the forward or backward direction) in which a relevant sub-packet is stored, with the start position as a reference. According to another embodiment of the present disclosure, when the RV includes three bits, the RV may be configured in such a form that positions in which sub-packets each having a high degree are stored in the HARQ buffer may be set to a start position, an intermediate position, and an end position, and that the relevant position may be indicated. Also, directions may be all set to one direction, and accordingly, the RV does not need to express a direction and can prevent a situation in which the stored sub-packets may overlap. According to still another embodiment of the present disclosure, when the RV includes three bits, the RV may be configured such that a start position and an end position of positions in which sub-packets each having a high degree are stored in the HARQ buffer may be set, the two bits of the RV may indicate a relevant position, and the remaining one bit of the RV may indicate a direction in which a relevant sub-packet is stored in the relevant position.

Figure 3B:
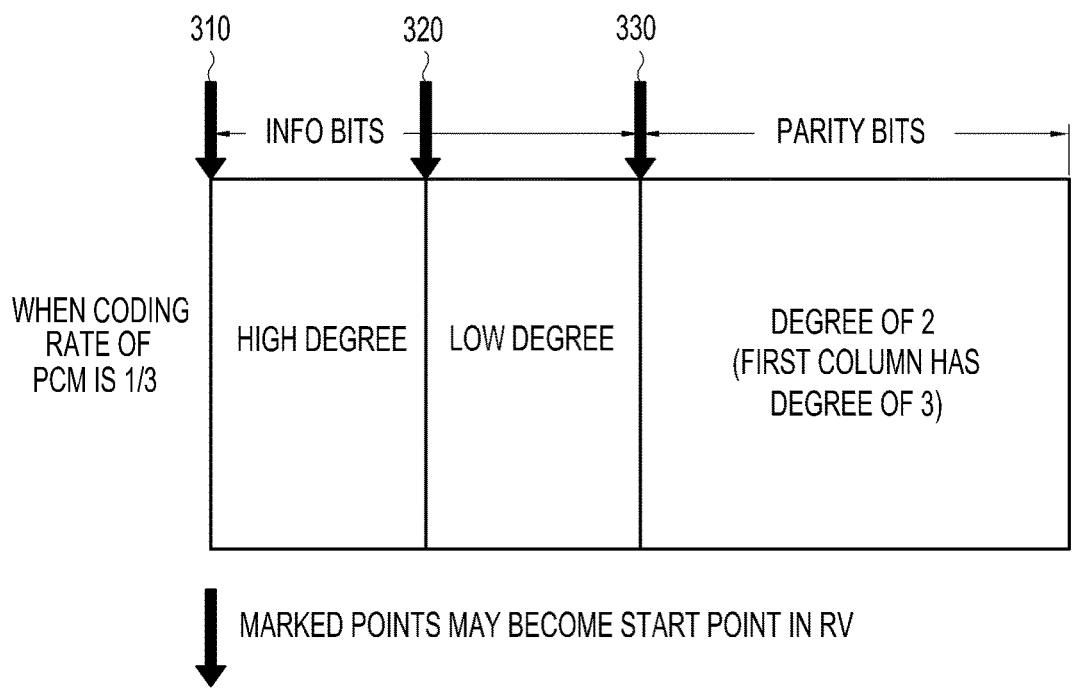
FIG. 3B illustrates an example of a form of storing data of a transmission terminal in a buffer during the operation of an IR-HARQ according to an embodiment of the present disclosure.

FIG. 3B illustrates an example of a form of storing data of a transmission terminal in a buffer during the operation of an IR-HARQ according to an embodiment of the present disclosure.

Referring to FIG. 3B, as an example, a case is illustrated in which, in view of a case where a PCM having a default coding rate of 1/3 is used, information bits and parity bits corresponding to the PCM are stored in the HARQ buffer during the operation of the IR-HARQ according to an embodiment of the present disclosure. In the present example, reference numeral 310 indicates a start position in which a sub-packet having a high degree among sub-packets including information bits is stored, and reference numeral 320 indicates a start position in which a sub-packet having a low degree among the sub-packets including the information bits is stored. Also, reference numeral 330 indicates a start position in which parity bits are stored. For example, consideration is given to a case where a degree of a check node corresponding to parity bits has 2 or 3. In this case, although not illustrated in the drawings, an area in which parity bits of the HARQ buffer are stored may also be configured to have a priority according to the value of the degree, for example, to be distinguished from each other by a column. Accordingly, among areas in which parity bits of the HARQ buffer are stored, parity bits corresponding to a check node having the degree of 3 may be stored in a first column, and parity bits corresponding to a check node having the degree of 2 may be stored in the remaining area.

Figure 4:
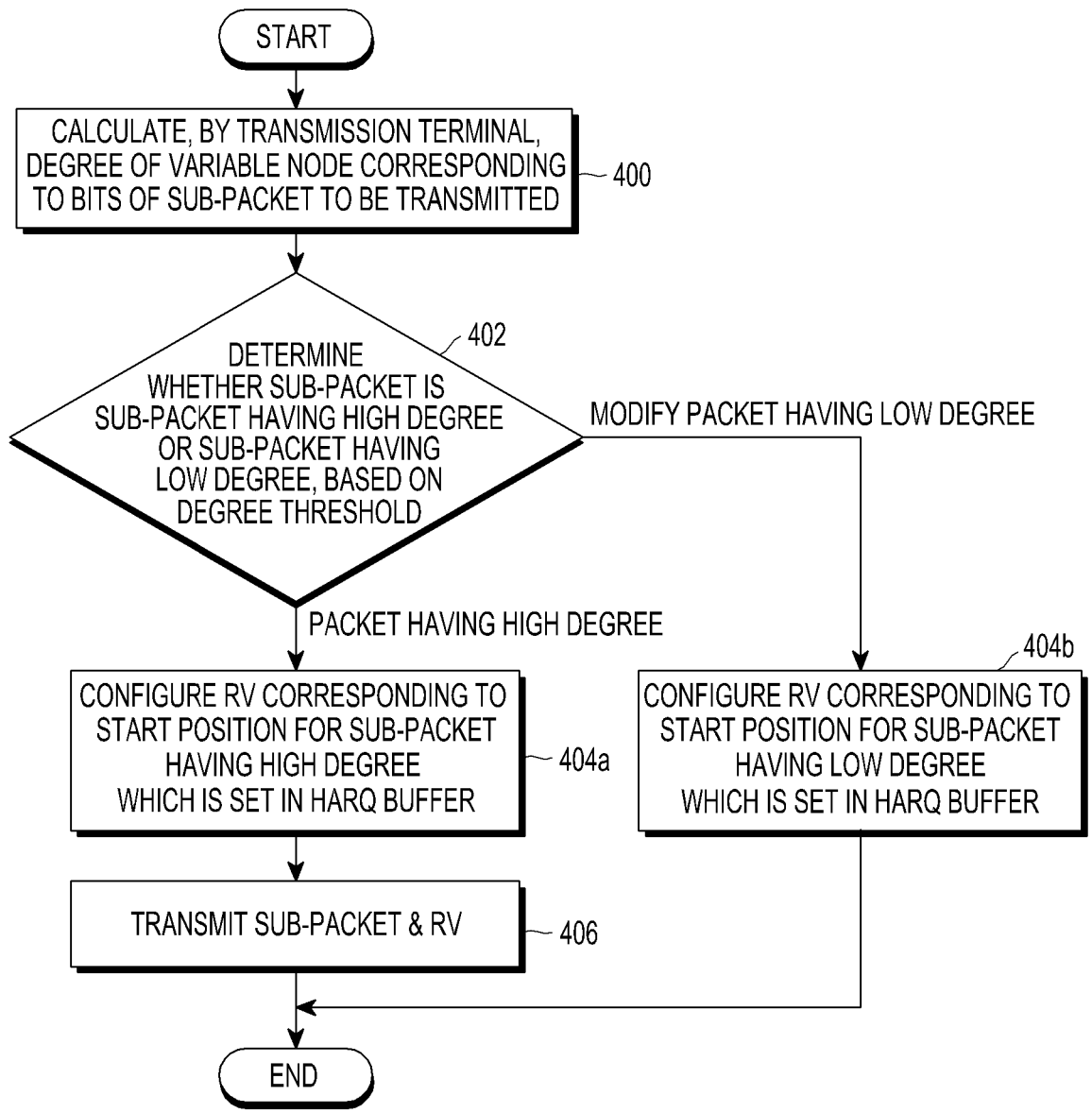
FIG. 4 illustrates a flow chart of an operation of a transmission terminal that operates an IR-HARQ buffer according to an embodiment of the present disclosure.

FIG. 4 illustrates a flowchart an operation of a transmission terminal that operates an IR-HARQ buffer according to an embodiment of the present disclosure.

Referring to FIG. 4, in operation 400, the transmission terminal calculates a degree of a variable node corresponding to bits of a sub-packet to be transmitted. In operation 402, the transmission terminal determines whether the sub-packet is a sub-packet having a high degree or a sub-packet having a low degree, on the basis of a degree threshold. When it is determined that the sub-packet is a sub-packet having a high degree, the transmission terminal proceeds to operation 404a. In operation 404a, the transmission terminal determines a start position and a direction in which the sub-packet having the high degree threshold is stored in the HARQ buffer, configures an RV indicating the start position and the direction, and proceeds to operation 406. In contrast, when it is determined that the sub-packet is a sub-packet having a low degree, in operation 404b, the transmission terminal configures an RV indicating a start position and a direction in which the sub-packet having the low degree is stored in the HARQ buffer, and proceeds to operation 406. In the present example, the configured RV may be set to include one bit or three bits as described above according to an embodiment of the present disclosure. In the present example, a start position, in which a sub-packet having a high or low degree is stored in the HARQ buffer, and a specific configuration and operation according to the number of bits of the RV may be described as in the embodiment of FIGS. 3A and 3B, and thus, a repeated description thereof will be omitted.

In operation 406, the transmission terminal transmits the relevant sub-packet through a data channel, and transmits the RV of the sub-packet through a control channel.

Figure 5:
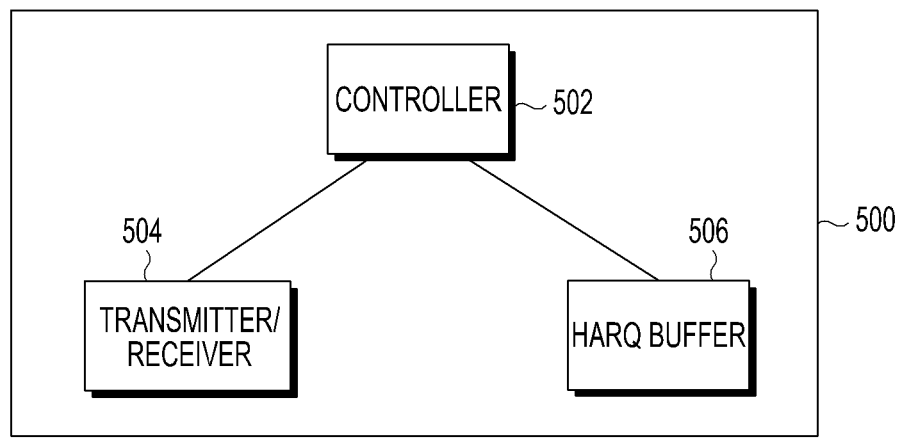
FIG. 5 illustrates an example of a configuration of a transmission terminal according to an embodiment of the present disclosure.

FIG. 5 illustrates an example of a configuration of a transmission terminal according to an embodiment of the present disclosure.

Referring to FIG. 5, the transmission terminal 500 may include a controller 502, a transmitter/receiver 504, and an HARQ buffer 506, as an example. The configuration of the transmission terminal 500 illustrated in FIG. 5 is described as an example, and the relevant sub-units may be subdivided into multiple sub-units or may be integrated into one unit, according to an embodiment of the present disclosure or an operator's intention.

The controller 502 controls an overall operation in such a manner that the transmitter/receiver 504 and the HARQ buffer 506 may operate according to the first and second embodiments of the present disclosure.

When a mother coding rate change request is received from a reception terminal through the transmitter/receiver 504, the controller 502 determines a temporary mother coding rate to be changed, on the basis of a current state of the battery of the reception terminal, a state of the HARQ buffer, and a channel state between the transmission terminal and the reception terminal, and delivers information, which is related to the determined temporary mother coding rate, to the reception terminal through the transmitter/receiver 504. Here, according to embodiments of the present disclosure, with respect to an operation of determining the temporary mother coding rate, a temporary mother coding rate determined by the reception terminal may be used, the temporary mother coding rate may be determined based on the current states of the battery and HARQ buffer corresponding to information indicating the current states of the battery and HARQ buffer transmitted in a state of being included in the mother coding rate change request by the reception terminal, or the temporary mother coding rate may be determined by using parameters acquired from a channel measurement report fed back from the reception terminal.

The controller 502 determines whether a sub-packet to be transmitted is a sub-packet having a low degree or a sub-packet having a high degree, on the basis of a degree threshold, determines a start position and a direction according to a result of the determination, and delivers the determined start position and direction to the HARQ buffer 506. Then, the HARQ buffer 506 stores the sub-packet in the start position and the direction corresponding to the result of the determination acquired from the controller 502.

A description of specific operations of the respective embodiments of the present disclosure overlaps the description made with reference to FIGS. 1 and 4, and thus, a detailed description thereof will be omitted.

Figure 6:
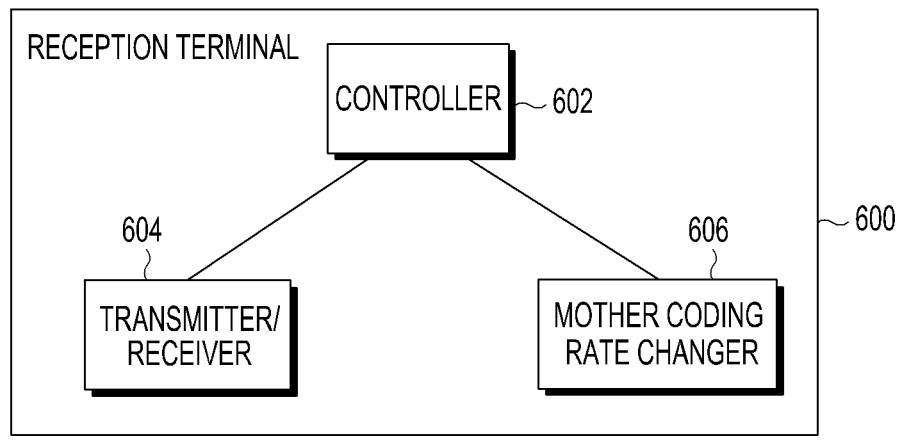
FIG. 6 illustrates an example of a configuration of a reception terminal according to an embodiment of the present disclosure.

FIG. 6 illustrates an example of a configuration of a reception terminal according to an embodiment of the present disclosure.

Referring to FIG. 6, the reception terminal 600 may include a controller 602, a transmitter/receiver 604, and a mother coding rate changer 606, as an example. The configuration of the reception terminal 600 illustrated in FIG. 6 is described as an example, and the relevant sub-units may be subdivided into multiple sub-units or may be integrated into one unit, according to an embodiment of the present disclosure or an operator's intention.

The controller 602 may control operations of the remaining elements in order to adaptively control a default mother coding rate according to an embodiment of the present disclosure.

The controller 602 controls the mother coding rate changer 606 to determine whether a mother coding rate is changed, at a time point which has been acquired from the transmission terminal or is predetermined. The mother coding rate changer 606 determines a current state of the battery of the reception terminal 600 and a current state of the HARQ buffer as in operation 104 of FIG. 1, and determines whether the current states of the battery and HARQ buffer satisfy a predetermined mother coding rate change condition. Then, when it is determined that the current states of the battery and HARQ buffer satisfy the predetermined mother coding rate change condition, the mother coding rate changer 606 transmits a mother coding rate change request to the transmission terminal through the transmitter/receiver 604. At this time, information included in the mother coding rate change request may become different according to the operation in operation 104 for each embodiment of the mother coding rate changer 606. That is, the information included in the mother coding rate change request may become different according to a case where the mother coding rate changer 606 directly determines a temporary mother coding rate or a case where the transmission terminal transmits information which helps to determine the temporary mother coding rate.

When the transmitter/receiver 604 receives information, which is related to a temporary mother coding rate to be currently used, from the transmission terminal, the controller 602 controls the reception terminal 600 to perform decoding and IR-HARQ operations in response to the temporary mother coding rate corresponding to the temporary mother coding rate-related information. A specific operation of the reception terminal 600 is performed similarly to the operation in the embodiment of FIG. 1, and thus, a repeated description thereof will be omitted.

Particular aspects of the present disclosure may be implemented as a computer-readable code on a computer-readable recording medium. The computer-readable recording medium is an optional data storage device that may store data readable by a computer system. Examples of the computer-readable recording medium may include a read-only memory (ROM), a random access memory (RAM), a compact disk-read only memory (CD-ROM), a magnetic tape, a floppy disk, an optical data storage device, and a carrier wave (e.g., transmission of data through the Internet). The computer-readable recording medium may also be distributed across computer systems connected to each other through a network, and thus, the computer-readable codes are stored and executed in a distributed manner. Also, functional programs, codes, and code segments for accomplishing embodiments of the present disclosure can be easily construed by programmers skilled in the field to which the present disclosure is applied.

Further, it will be appreciated that the method and the apparatus according to an embodiment of the present disclosure may be implemented in the form of hardware, software, or a combination thereof. Any such software may be stored, for example, in a volatile or non-volatile storage device such as a ROM, a memory such as a RAM, a memory chip, a memory device or a memory integrated circuit, or a storage medium, such as a compact disc (CD), a digital versatile disc (DVD), a magnetic disk or a magnetic tape, which is optically or magnetically recordable and simultaneously, is readable by a machine (e.g., a computer), regardless of whether the software can be deleted or rewritten. It will be appreciated that the method according to an embodiment of the present disclosure may be implemented by a computer or a portable reception terminal including a controller and a memory, and that the memory is an example of a machine-readable storage medium suitable for storing a program or programs including instructions for implementing the embodiments of the present disclosure.

Accordingly, embodiments of the present disclosure include a program including codes for implementing an apparatus or a method which is set forth in any claim of this specification, and a storage medium that stores the program and is readable by a machine (a computer, etc.). Also, the program may be electronically conveyed by any medium such as a communication signal transmitted through a wired or wireless connection, and the present disclosure suitably includes equivalents of the program.

Further, the apparatus according to an embodiment of the present disclosure may receive and store the program from a program providing device that is wiredly or wirelessly connected to the apparatus. The program providing device may include a memory that stores a program including instructions which cause the program processing device to perform a preset content protection method, information required for the content protection method, and the like; a communication unit that performs wired or wireless communication with the graphic processing device; and a controller that transmits the relevant program to the transmission/reception device, at a request from the graphic processing device or automatically.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for transmitting a signal by a transmission terminal in a communication system using a low density parity check (LDPC) code, the method comprising:
   receiving, from a reception terminal, a change request for changing a coding rate of the LDPC code;
   determining a first coding rate based on the change request;
   transmitting, to the reception terminal, the first coding rate in response to the change request;
   identifying a degree of a variable node of a parity check matrix corresponding to information bits included in a codeword packet encoded in response to the first coding rate based on a degree threshold; and
   storing the information bits, that correspond to a first variable node including a higher degree than a first degree of the degree threshold, in a first partial area including a higher transmission priority than a transmission priority of a second partial area for storing the information bits corresponding to a second variable node including a lower degree than the first degree of the degree threshold among partial areas of a circular buffer, wherein the change request for changing the coding rate comprises at least one of information indicating a second coding rate determined by the reception terminal, or information indicating a state of the reception terminal.

2. The method of claim 1, wherein determining the first coding rate comprises:
determining, as the first coding rate, a coding rate determined based on a channel state between the transmission terminal and the reception terminal, if a coding rate corresponding to the information indicating the second coding rate included in the change request is different than the coding rate determined based on the channel state.

3. The method of claim 1, further comprising:
transmitting the information bits corresponding to the variable node including the higher degree on a data channel; and
transmitting information corresponding to the first partial area including the higher transmission priority on a control channel.

4. The method of claim 3, wherein the information corresponding to the partial areas comprises:
information indicating a start position of the first partial area including the higher transmission priority; and
information indicating a direction in which the information bits corresponding to the variable node including the higher degree are stored in the first partial area including the higher transmission priority.

5. The method of claim 3, wherein the information corresponding to the partial areas comprises information indicating at least one of a start, a middle, or an end of the first partial area including the higher transmission priority.

6. The method of claim 1, wherein the changing of the coding rate of the LDPC code is determined based on a battery state of the reception terminal and a buffer state of the reception terminal.

7. A method for receiving a signal by a reception terminal in a communication system using a low density parity check (LDPC) code, the method comprising:
determining whether a change of a coding rate of the LDPC code is required;
transmitting, to a transmission terminal, a coding rate change request if the change of the coding rate of the LDPC code is required; and
receiving, from the transmission terminal, a first coding rate in response to the coding rate change request,
wherein the coding rate change request comprises at least one of:
information indicating a second coding rate determined by the reception terminal, or
information indicating a state of the reception terminal, and
wherein, determining whether the change of the coding rate of the LDPC code is required comprises:
if at least one of a battery state of the reception terminal or a buffer state of the reception terminal satisfies a predetermined coding rate change condition, determining the second coding rate based on the battery state or the buffer state.

8. The method of claim 7, wherein whether the change of the coding rate of the LDPC code is required is determined based on the battery state of the reception terminal and the buffer state of the reception terminal.

9. A transmission terminal for transmitting a signal in a communication system using a low density parity check (LDPC) code, the transmission terminal comprising:

a transceiver configured to:
receive, from a reception terminal, a change request for changing a coding rate of the LDPC code, and
transmit, to the reception terminal, a first coding rate in response to the change request; and
a controller configured to:
determine the first coding rate based on the change request,
identify a degree of a variable node of a parity check matrix corresponding to information bits included in a codeword packet encoded in response to the first coding rate based on a degree threshold, and
store the information bits, that correspond to a first variable node including a higher degree than a first degree of the degree threshold, in a first partial area including a higher transmission priority than a transmission priority of a second partial area for storing the information bits corresponding to a second variable node including a lower degree than the first degree of the degree threshold among partial areas of a circular buffer,
wherein the change request for changing the coding rate comprises at least one of information indicating a second coding rate determined by the reception terminal, or information indicating a state of the reception terminal.

10. The transmission terminal of claim 9, wherein the controller is further configured to determine, as the first coding rate, a coding rate based on a channel state between the transmission terminal and the reception terminal, if a coding rate corresponding to the information indicating the second coding rate included in the change request is different than the coding rate determined based on the channel state.

11. The transmission terminal of claim 9, wherein the controller is further configured to:
transmit the information bits corresponding to the variable node including the higher degree on a data channel; and
transmit information corresponding to the first partial area including the higher transmission priority on a control channel.

12. The transmission terminal of claim 11, wherein the information corresponding to the partial areas comprises:
information indicating a start position of the first partial area including the higher transmission priority; and
information indicating a direction in which the information bits corresponding to the variable node having the higher degree are stored in the first partial area including the higher transmission priority.

13. The transmission terminal of claim 11, wherein the information corresponding to the partial areas comprises information indicating at least one of a start, a middle, or an end of information indicating a position of the first partial area including the higher transmission priority.

14. The transmission terminal of claim 9, wherein the changing of the coding rate of the LDPC code is determined based on a battery state of the reception terminal and a buffer state of the reception terminal.

15. A reception terminal for receiving a signal in a communication system using a low density parity check (LDPC) code, the reception terminal comprising:
a controller configured to determine whether a change of a coding rate of the LDPC code is required; and
a transceiver configured to:
transmit a coding rate change request to a transmission terminal if the change of the coding rate of the LDPC code is required, and receive, from the transmission terminal, a first coding rate in response to the coding rate change request, wherein the coding rate change request comprises at least one of:
  information indicating a second coding rate determined by the reception terminal, or
  information indicating a state of the reception terminal, and wherein, if at least one of a battery state of the reception terminal or a buffer state of the reception terminal satisfies a predetermined coding rate change condition, the controller is further configured to:
  determine the second coding rate based on the battery state or the buffer state, and
  transmit the coding rate change request including the information indicating the second coding rate.

16. The reception terminal of claim 15, wherein whether the change of the coding rate of the LDPC code is required is determined based on the battery state of the reception terminal and the buffer state of the reception terminal.

* * * * *